United States Patent [19]

Katz et al.

[11] Patent Number: 4,513,423
[45] Date of Patent: Apr. 23, 1985

[54] ARRANGEMENT FOR DAMPING THE RESONANCE IN A LASER DIODE

[75] Inventors: Joseph Katz, Pasadena; Amnon Yariv, San Marino; Shlomo Margalit, South Pasadena, all of Calif.

[73] Assignee: The United States of America as represented by the Administrator of the National Aeronautics and Space Administration, Washington, D.C.

[21] Appl. No.: 385,220

[22] Filed: Jun. 4, 1982

[51] Int. Cl.³ .............................................. H01S 3/19
[52] U.S. Cl. .................................... 372/50; 357/17; 357/40; 357/46; 372/46; 372/38
[58] Field of Search ................... 372/44, 38, 50, 46; 357/17, 14, 46, 40, 34

[56]  References Cited

U.S. PATENT DOCUMENTS 4,349,906  9/1982  Scifres et al. ..................... 372/50
4,361,887  11/1982 Nakamura et al. ................. 372/50
4,408,330  10/1983 An ..................................... 372/46
4,430,741  2/1984  Fukuzawa et al. ................. 372/46

OTHER PUBLICATIONS

H. Kressel and J. K. Butler, "Semiconductor Lasers and Heterojunction Leds," Academic Press, N.Y. 1977 (Ch. 17).
T. Hong and Y. Suematsu, "Suppression of Resonance-Like Phenomena in the Light Output of Directly Modulated Injection Lasers by π-Type Suppressor Circuit," The Trans. IECE, Japan, E61, pp. 121–124, (1978).
Y. Suematsu and T. Hong, "Suppression of Relaxation Oscillation in Light Output of Injection Lasers by Electrical Resonance Circuit", IEEE J. Quant. Electron, QE-13, pp. 756–762, (1977).
K. Furuya, Y. Suematsu, and T. Hong, "Reduction of Resonance-Like Peak in Direct Modulation Due to Carrier Diffusion in Injection Laser," Applied Optics, 17, pp. 1949–1952, (1978).
N. Chinone, K. Aiki, M. Nakamura, and R. Ito, "Effects of Lateral Mode and Carrier Density Profile on Dynamic Behaviors of Semiconductor Lasers," IEEE J. Quant. Electron, QE-14, pp. 625–631, (1978).
D. Wilt, K. Y. Lau and A. Yariv, "The Effect of Lateral Carrier Diffusion on the Modulation Response of a Semiconductor Laser," J. Appl. Phys., 52, pp. 4970–4974, (1981).

Primary Examiner—James W. Davie
Attorney, Agent, or Firm—Paul F. McCaul; John R. Manning; Thomas H. Jones

[57]  ABSTRACT

An arrangement for damping the resonance in a laser diode includes an additional layer (25) which together with the conventional laser diode form a structure (35) of a bipolar transistor. Therein, the additional layer serves as the collector, the cladding layer (12) next to it as the base, and the active region (11) and the other cladding layer (13) as the emitter. A capacitor (30) is connected across the base and the collector. It is chosen so that at any frequency above a certain selected frequency ($f_c$) which is far below the resonance frequency ($f_{res}$) the capacitor impedance is very low, effectively shorting the base to the collector.

16 Claims, 11 Drawing Figures

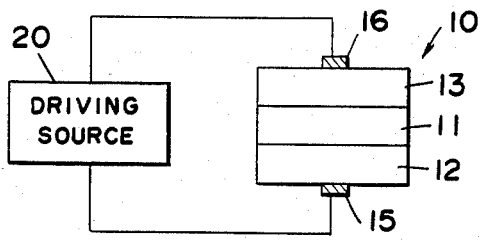
FIG. 1
PRIOR ART
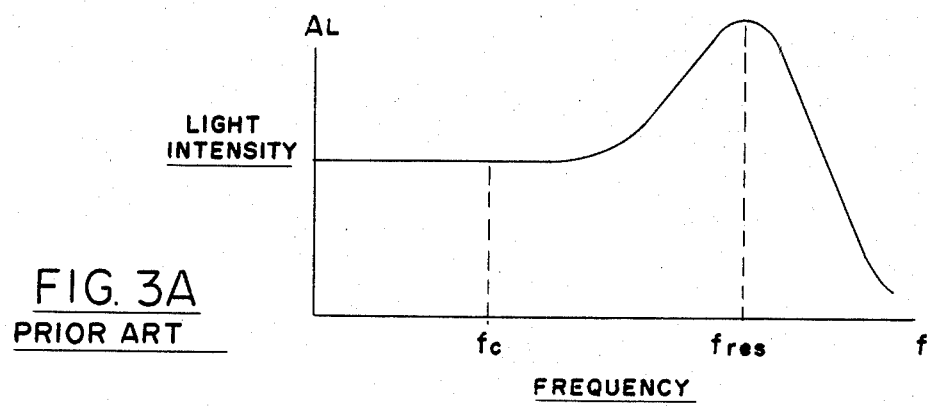
FIG. 2
PRIOR ART
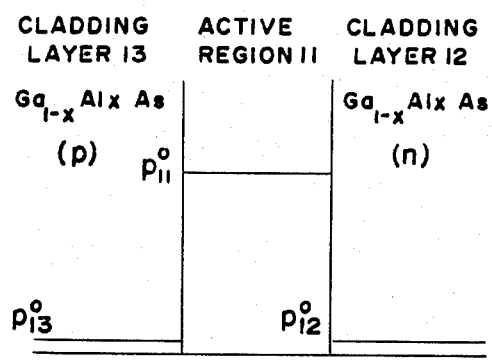
FIG. 3A
PRIOR ART
FIG. 3B
PRIOR ART
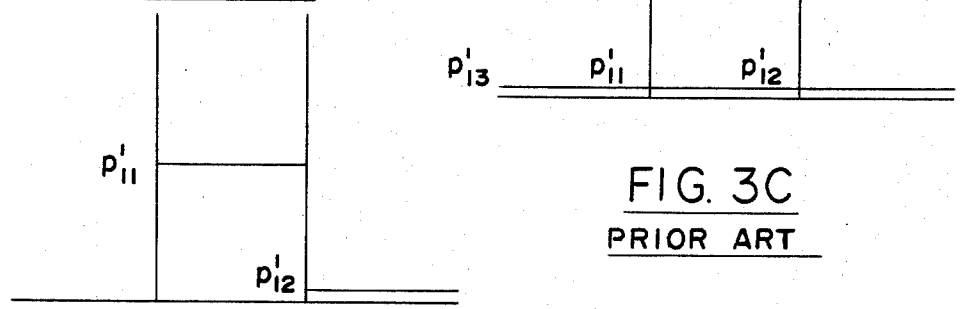
FIG. 3C
PRIOR ART

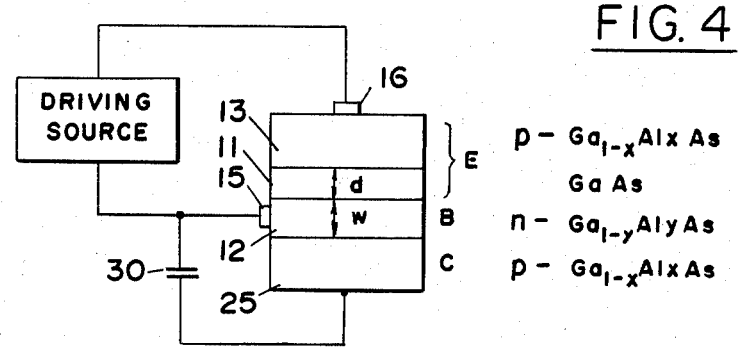
FIG. 4
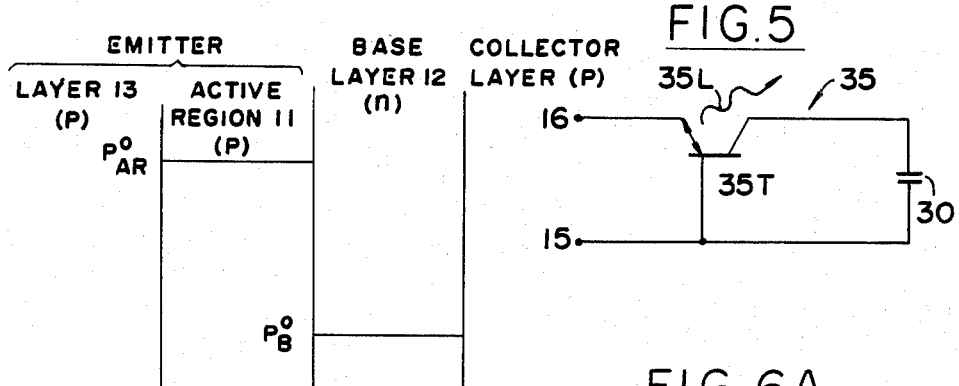
FIG. 5
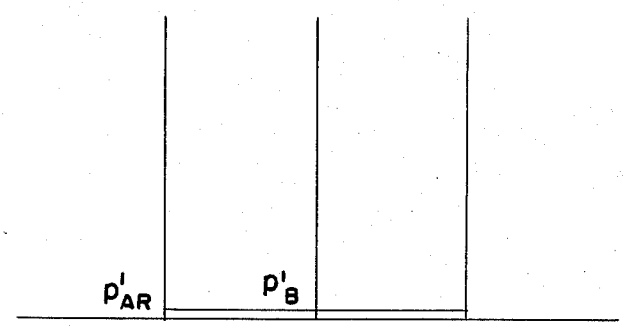
FIG. 6A
FIG. 6B
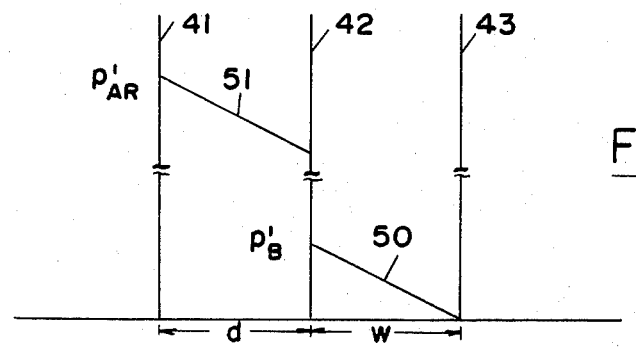
FIG. 6C

ARRANGEMENT FOR DAMPING THE RESONANCE IN A LASER DIODE

ORIGIN OF THE INVENTION

The invention described herein was made in the performance of work under a NASA contract and is subject to the provisions of Section 305 of the National Aeronautics and Space Act of 1958, Public Law 85-568 (72 Stat., 435; 42 USC 2457).

BACKGROUND OF THE INVENTION

1. Field of the Invention

The present invention relates to injection laser diodes and, more particularly, to such diodes with resonance damping means.

2. Description of the Prior Art

There are many applications for injection laser diodes, including applications requiring modulation at high frequencies. As is appreciated by those familiar with the art, an injection laser diode, hereafter simply referred to as the laser diode, experiences resonance. It is this resonance which sets the upper limit on the useful frequency range within which the laser diode can be modulated, without experiencing resonance. This aspect is discussed in the prior art literature, e.g., in "Semiconductors Lasers and Heterounction Leds", by Kressel et al., Academic Press, New York, 1977. Briefly, as is appreciated, the resonance peak can be reduced, i.e., the resonance dampened, by reducing the effective lifetime of the carriers in the active region of the laser diode.

Various arrangements have been suggested to achieve such reduction. These arrangements include connecting an electrical network in parallel with the laser diode, utilizing the mechanism of carrier diffusion out of the active region, or with the addition of another laser to direct light to the active region. Some of these arrangements are suggested in the following prior art references:

T. Hong and Y. Suematsu, "Suppression of Resonance-Like Phenomena in the Light Output of Directly Modulated Injection Lasers by $\pi$-Type Suppressor Circuit," The Trans. IECE Japan, E61, pp. 121-124 (1978).

Y. Suematsu and T. Hong, "Suppression of Relaxation Oscillation in Light Output of Injection Lasers by Electrical Resonance Circuit," IEEE J. Quant. Electron. QE-13, pp. 756-762 (1977).

K. Furuya, K. Suematsu, and T. Hong, "Reduction of Resonance-like Peak in Direct Modulation Due to Carrier Diffusion in Injection Laser," Applied Optics 17, pp. 1949-1952 (1978).

N. Chinone, K. Aiki, M. Nakamura, and R. Ito, "Effects of Lateral Mode and Carrier Density Profile on Dynamic Behaviors of Semiconductor Lasers," IEEE J. Quant, Electron. QE-14, pp. 625-631 (1978).

D. Wilt, K. Y. Lau and A. Yariv, "The Effect of Lateral Carrier Diffusion on the Modulation Response of a Semiconductor Laser," J. Appl. Phy., 52, pp. 4970-4974 (1981).

All of these arrangements, except for the carrier diffusion, suffer from one very basic disadvantage, namely the need for extensive networks, such as a multicomponent circuit, e.g., an RLC or Pi-shaped network or an additional laser, all of which are external to the laser diode. Whereas a laser diode, by itself, is extremely small, which is highly desirable, the need to attach a much larger network to it, greatly increases the overall size of the resonance-damped laser diode. This increase in size is highly undesirable, and often unacceptable. As to the use of carrier diffusion to dampen the laser diode's resonance, it results in reduced laser efficiency at all frequencies, including those below resonance. Such efficiency loss is clearly undesirable. A need therefore exists for a new arrangement to dampen the resonance of a laser diode. Alternately stated, a need exists for an arrangement to dampen the resonance of a laser diode, without appreciably increasing its actual size, or without considerably affecting its efficiency.

OBJECTS AND SUMMARY OF THE INVENTION

It is a primary object of the present invention to provide a new improved laser diode.

Another object of the present invention is to provide a new improved laser diode with resonance damping.

A further object of the present invention is to provide a new improved laser diode in which its resonance is dampened with a minimal increase in its actual size.

A further object of the present invention is to provide a laser diode in which adverse effects as a result of carrier concentrations in the active region are reduced.

These and other objects of the invention are achieved by structuring the laser diode with an additional layer, so that the laser together with this additional layer, form a bipolar transistor. Basically, whereas a laser diode, ignoring the substrate on which it is grown, consists of an active region, bounded by two cladding layers, in accordance with the present invention, the laser is grown so that one of its cladding layers and the active region form the emitter of a bipolar transistor, and the other cladding layer forms the transistor base. The added cladding layer is the collector. Means are included to virtually short the base to the collector above a frequency which is well below the resonance frequency. In such an arrangement, an AC component of carriers attempts to build up at the base, due to the short of the base to the collector, diffusion current flows out of the base. This current flow causes a current to flow from the active region to the base, thereby reducing the effective lifetime of carriers in the active region, thus damping the resonance.

BRIEF DESCRIPTION OF THE DRAWINGS

FIGS. 1, 2, 3A, 3B and 3C are diagrams useful in explaining the operation of a prior art laser diode and the problems associated therewith;

FIGS. 4 and 5 are diagrams useful in describing an embodiment of the novel laser diode, in accordance with the present invention;

FIGS. 6A, 6B and 6C are excess carriers concentrations, useful in explaining the operation and the variances of the novel translaser.

DETAILED DESCRIPTION OF THE DRAWINGS

Figure 7:
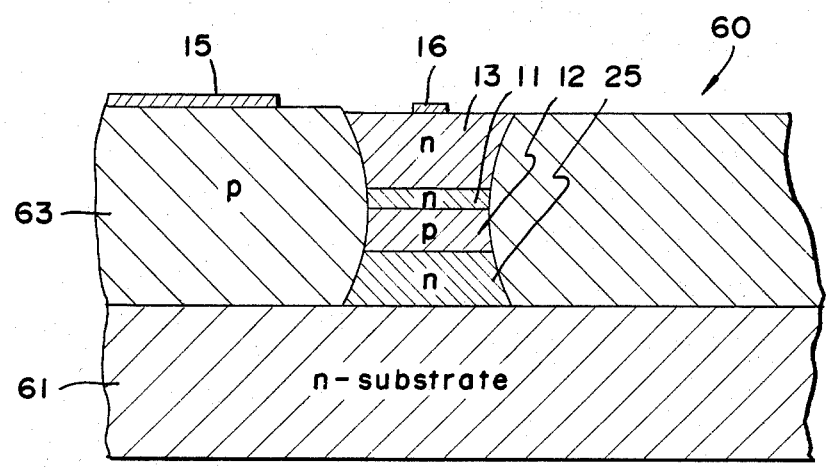
FIG. 7 is a diagram of a monolithic structure of the novel translaser.

In order to explain the present invention, with its unique unobvious features, attention is first directed to FIGS. 1, 2, 3A, 3B and 3C, in connection with which the prior art and the problems associated therewith will first be discussed.

FIG. 1 is a simplified diagram of an injection laser diode 10, consisting of an active region 11 and two cladding layers 12 and 13. The latter are assumed to be n and p doped, respectively, thus basically forming a pn diode. Contacts 15 and 16 on the cladding layers 12 and 13 are used to connect the laser 10 to a driving source 20. As is appreciated, the source 20 provides a driving signal, consisting of a DC biasing component and a frequency modulated component, hereafter also referred to as the AC signal, in order to drive the laser to provide an output, which is a faithful reproduction of the AC signal.

As is further appreciated, such a laser experiences resonance at a resonance frequency $f_{res}$, shown in FIG. 2, which is a diagram of the laser light output intensity, $A_L$ vs. frequency (f). There are several adverse effects on the modulation performance of the laser diode, such as relaxation oscillations (ringing). These adverese effects are present when the laser modulation rate is not only in the frequency range about $f_{res}$, but also at much lower frequencies. This is due to the fact that an AC signal, such as a square wave or pulse train even far below $f_{res}$, may include harmonics, one or more of which may be within the resonance frequency range. Therefore, even when the laser is driven at frequencies far below resonance, ringing is often experienced.

As analyzed in the prior art, the resonance of the laser dioide, which is due to the interaction between the carriers and the photon population, manifests itself also by an establishment of an appreciable AC component of carrier density in the active region 11. This aspect may best be highlighted by the diagrams of FIGS. 3A–3C, wherein the excess minority carrier concentration profiles in the active region and in the cladding layers, particularly layer 12, are shown. For explanatory purposes, it is assumed that layer 12 is n type $Ga_{1-y}Al_yAs$, while the cladding layer 13 is p type. The y designates the percentage of Al with respect to the Ga. FIG. 3A diagrams the profile of the DC component of the carriers. $P_{11}^0$ designates the carrier concentration in the active region 11, the subscript 11 designating the active region and the postscript 0, designating the DC component. $P_{12}^0$ and $P_{13}^0$ designate the minority carrier concentrations in layers 12 and 13, respectively. For the following description, only the concentrations of carriers in layer 11, hereafter simply referred to as the active region 11 and the cladding layer 12, are of importance.

As to FIG. 3B, it designates the small signal AC component of the minority carrier concentrations at frequencies far below resonance. The postscript 1 intends to designate small carrier signal AC component of minority concentrations. As is appreciated, under such conditions, clamping takes place and therefore no AC component of carrier concentrations can take place in the active region 11 or in the adjacent cladding layer. As the frequency or harmonic(s) of the AC signal approaches the resonance range, significant increases in the concentrations of AC component of carriers in the active region 11 and in the cladding layer 12 take place, as shown in FIG. 3C.

As has been further appreciated, the resonance can be dampened by decreasing the lifetime of the AC component of the carriers in the active region. This may be achieved by sweeping such carriers out of the active region. In the prior art, various arrangements to accomplish this end have been suggested, as previously pointed out. Many of them are discussed in the above-cited prior art references. As pointed out, all prior art arrangements are deemed unsatisfactory, since they require the incorporation of relatively large elements, external to the very small laser diode. Thus, they effectively convert the resonance dampened laser diode to a physically large system. This increase destroys the advantages of the smallness of the laser diode, severely limiting its usefulness in many systems. Also, some of the prior art suggested damping arrangements, which use external electrical networks, are unsatisfactory, since they have to be returned due to changes in the laser resonance frequency, as a result of laser aging.

Practically, all of the disadvantages of the prior art resonance damping arrangements are eliminated by the present invention, which will first be explained in connection with FIGS. 4, 5, 6A, 6B and 6C. In accordance with the present invention, the laser diode is grown with an additional layer 25, below the cladding layer 12. In the present invention, this additional layer acts as the collector (C) of a bipolar transistor, while cladding layer 12 serves as the base (B). The active region 11 together with cladding layer 13 acts as the transistor's emitter (E). In the particular example, shown in FIG. 4, the transistor is assumed to be of the PNP type, due to the particular doping shown for the various layers. However, it should be apparent that if desired, the transistor can be of the NPN type. Also, although the transistor is assumed to be of the GaAlAs type, other semiconductor materials can be used.

In addition to the added collector layer 25, which is monolithically grown, as part of the laser growth and which, from a physical dimension point of view, only increases the laser size by an insignificant amount, in accordance with the invention, capacitive means, e.g., a capacitor 30, is connected between the base layer 12 and the collector layer 25. The capacitance of capacitor 30 is chosen so that at any frequency $f_c$ (See FIG. 2), way below $f_{res}$, the impedance between layers 12 and 25 is so small as to be deemed a short. Although the impedance may be several ohms, preferably it should be of one ohm or less.

The novel laser diode structure, which acts, both as a laser and transistor, may be referred to as a translaser. In FIG. 5, the semiconductor device of FIG. 4 is designated generally by the numeral 35 shown as either a PNP or NPN transistor 35T, by the double arrowed emitter line, with the laser aspect being designated by the wavy arrow 35L.

The advantages, realized from such an arrangement, may be explained in connection with FIGS. 6A through 6C, which are similar to FIGS. 3A–3C in that they are diagrams of carrier concentration profiles in the active region 11 and in the base layer 12 for the DC component of the minority carriers, the AC component of the minority carriers, way below resonance, and the AC component of the minority carriers at frequencies near resonance, respectively. As to FIG. 6B at low frequencies, i.e., at frequencies far below resonance clamping occurs, as in the prior art, and therefore there is no AC component of carrier concentration in the active region 11. Thus, no resonance occurs. In FIG. 6B, $P'_{AR}$ designates carrier concentration in the active region, and $P'_B$ for the base layer 12. As to FIG. 6A, it is similar to FIG. 3A except that in FIG. 6A, the concentration of the DC component of minority carriers in the base layer 12 is somewhat greater than that in the prior art. The reasons for this difference will be explained hereafter.

As to FIG. 6C, it represents the AC component of minority carrier concentration near or at resonance frequencies. Therein, lines 41–43 represent the junctions between the layer 13-active region 11, the active region 11-base layer 12, and the base layer 12-collector layer 25, respectively. Also, therein the letter d represents the thickness of the active region 11 and W the thickness of the base layer 12.

At any of the frequencies, above $f_c$ (See FIG. 2), i.e., when the base layer 12 is shorted to the collector layer 25, as the A concentration of AC component minority carriers in the active region, starts to increase, as represented by $P_{AR}{}^1$, in FIG. 6C, wherein AR stands for active region, a related amount of AC component minority carrier concentration attempts to increase in the base layer, near the active region, as designated by $P_B{}^1$. However, since the base layer is shorted to the collector at the base-collector junction 43, the AC component minority carrier concentration is zero. Thus, a diffusion current is made to flow in the base layer 12, thereby reducing the AC component minority carrier concentration in the base, as represented by line 50. This diffusion current is sustained by drawing these carriers from the active region 11, thereby effectively reducing their lifetime, in the active region. As a result, the resonance is dampened.

Alternately stated, by shorting the base layer, any concentration of AC component minority carriers in the base layer produces a gradient, represented by the slope of line 50. As a result of this gradient, a diffusion current flows, which sweeps AC component minority carriers from the active region, thus producing a gradient in the active region, which is represented by the slope of line 51, and which is the same as the slope of line 50.

It should be apparent that the greater the gradient, i.e., the greater the slope, the faster AC component minority carriers are swept out of the active region. Thus, one wants the slope or the gradient in the base to be as great as possible. The gradient in the base is dependent on two factors—the amount of Al in the base material and the thickness W of the base. For a given base thickness W, one can increase the gradient by reducing the amount of Al in the base material. However, by reducing the Al, the DC component minority carrier concentration in the base, due to the driving signal DC component increases, as shown in FIG. 6A, as compared to FIG. 3A. This increse may result in some loss in the efficiency of the laser at all frequencies. One can also increase the gradient in the base by growing it with a thickness W as small as practically possible. In accordance with the present invention, the base layer 12 may be grown to a minimal thickness of W on the order of 0.1 $\mu$m (1000° A) and the amount of Al in the base material may be chosen so that the loss of efficiency is held to a minimum. For example, in a conventional $Ga_{1-y}Al_yAs$ laser diode in the cladding layer 12, which is the base layer in the present invention, y is on the order of 0.3 to 0.4. In the present invention, by reducing y to about 0.1 to 0.15, with a base thickness W of the order of 0.1 $\mu$m a sufficiently steep gradient is produced to properly dampen the laser, without significantly affecting the laser's efficiency.

It should also be stressed that since the capacitance of capacitor 30 is chosen to produce an effective short at $f_c$, which is far below $f_{res}$, damping of the resonance occurs, irrespective of any shift in $f_{res}$, due to laser aging, without having to change or tune capacitor 30.

In FIG. 4, the capacitor 30 which is assumed to provide a short at frequencies above $f_c$ is shown as a discrete component, external to the monolithic structure of the transistor 35. It should be stressed that even when so incorporated, the transistor 35 is significantly more advantageous than prior art arrangements. Herein, only a single external element, i.e. capacitor 30, which does not require tuning, is needed. In some of the prior art arrangements, the external networks require several components, which often have to be retuned, due to shifts in $f_{res}$.

However, if desired, the shorting impedance, provided by capacitor 30, at $f \geq f_c$ to produce the base to collector short, may be achieved in a monolithic structure, such as the buried heterostructure, shown in FIG. 7. The structure 60 comprises an n doped substrate 61 on which layers 25, 12, 11 and 13 are successively grown. These layers are buried within a p-doped layer 63. A relatively wide strip of appropriate matter, e.g. gold is deposited on layer 63 to form the base contact 15.

In such an arrangement, the capacitance is provided by the inherent junction capacitance between the n type substrate 61 and the p type burying layer 63. The substrate 61 is effectively shorted to the collector 25, and the p type layer 63 is effectively shorted to base layer 12. As shown contact 15 extends along the surface of layer 63 in order to effectively shorten the lateral parasitic resistances across it.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. In a structure of an injection laser diode, an improvement comprising:
   first, second, third and fourth layers of semiconductor material grown one upon the other, each of preselected properties, said second layer comprising the active region of said laser diode with said first and third layers on opposite sides of said second layer representing the diode's cladding layers, said first and second layers together forming an emitter of a bipolar transistor, said third layer forming the base and said fourth layer forming the transistor collector;
   a laser diode driving source connected between said first and third layers respectively; and
   impedance means comprising capacitance for providing an impedance which is not greater than a preselected value connected between said third and fourth layers when said laser is driven by said driving source with signals of a frequency not less than a preselected frequency.

2. A structure as recited in claim 1 wherein the preselected value of said impedance provided by said capacitive means, definable as Z, is on the order of not more than several ohms when the frequency of the signals from said driving source is not less than said preselected frequency.

3. A structure as recited in claim 2 wherein Z is on the order of not more than one ohm.

4. A structure as recited in claim 1 wherein said impedance means consist of a capacitor externally connected between said third layer, defining a transistor base, and the fourth layer, which defines a transistor collector.

5. A structure as recited in claim 4 wherein the preselected value of said impedance provided by said capacitive means, definable as Z, is on the order of not more than one ohm when the frequency of the signals from said driving source is not less than said preselected frequency.

6. A structure as recited in claim 1 further including a substrate on which said layers are grown starting with said fourth layer, said impedance means comprising a layer of matter grown on said substrate and in contact with at least said third and fourth layers for providing said impedance.

7. A structure as recited in claim 6 wherein the preselected value of said impedance provided by said impedance means, definable as Z, is on the order of not more than several ohms when the frequency of the signals from said driving source is not less than said preselected frequency.

8. A structure as recited in claim 7 wherein Z is on the order of not more than one ohm.

9. In a solid state laser diode structure including an active region layer and first and second cladding layers doped to opposite polarities, said first cladding layer on one side of said active region layer and said second cladding layer on the side opposite said one side of said active region layer, an arrangement for damping the resonance of said laser diode when said laser diode is driven by a signal including an AC signal component with at least one harmonic at a frequency within the resonance frequency range of said laser, comprising:

an additional layer in contact with one of said cladding layers, said additional layer being doped with a polarity opposite to that of the cladding layer adjacent thereto; and impedance means comprising capacitance connected to said additional layer and said cladding layer adjacent thereto, for providing an impedance which is not greater than a preselected value when said laser diode is driven with an AC signal component at a frequency not less than a frequency definable as $f_c$ which is below the resonance frequency range.

10. An arrangement as recited in claim 9 wherein said preselected value of said impedance provided by said capacitance, definable as Z, is on the order of not more than several ohms when the frequency of the signals from said driving source is not less than said preselected frequency.

11. An arrangement as recited in claim 10 wherein Z is on the order of not more than one ohm.

12. An arrangement as recited in claim 9 wherein said impedance means consist of a capacitor externally connected between said third layer, defining a transistor base, and a fourth layer which defines a transistor collector.

13. An arrangement as recited in claim 12 wherein the preselected value of said impedance provided by said impedance means, definable as Z, is on the order of not more than one ohm when the frequency of the signals from said driving source is not less than said preselected frequency.

14. An arrangement as recited in claim 9 wherein said arrangement includes a substrate on which said additional layer and the laser diode layers are grown successively, and wherein said impedance means comprises a layer of semiconductor material on said substrate and in contact with at least said additional layer and the cladding layer adjacent thereto for providing the impedance therebetween.

15. An arrangement as recited in claim 14 wherein the preselected value of said impedance provided by said capacitive means, definable as Z, is on the order of not more than several ohms when the frequency of the signals from said driving source is not less than said preselected frequency.

16. An arrangement as recited in claim 15 wherein Z is on the order of not more than one ohm.

* * * * *